United States Patent
Yeh et al.

(10) Patent No.: US 6,807,732 B2
(45) Date of Patent: Oct. 26, 2004

(54) METHODS FOR MODIFYING INNER-LAYER CIRCUIT FEATURES OF PRINTED CIRCUIT BOARDS

(75) Inventors: Albert An-Bon Yeh, Colorado Springs, CO (US); Regina Nora Pabilonia, Colorado Springs, CO (US); Thomas James Weaver, Colorado Springs, CO (US); Arthur Fong, Colorado Springs, CO (US)

(73) Assignee: Agilent Technologies, Inc., Palo Alto, CA (US)

(*) Notice: Subject to any disclaimer, the term of this patent is extended or adjusted under 35 U.S.C. 154(b) by 141 days.

(21) Appl. No.: 10/202,738

(22) Filed: Jul. 24, 2002

(65) Prior Publication Data

US 2004/0016116 A1 Jan. 29, 2004

(51) Int. Cl.⁷ ................................................ H05K 3/02
(52) U.S. Cl. ......................... 29/847; 29/825; 29/846; 430/30
(58) Field of Search .......................... 29/825, 846, 847, 29/830, 831, 832, 840, 852; 430/30

(56) References Cited

U.S. PATENT DOCUMENTS

| | | | | |
|---|---|---|---|---|
| 6,165,658 A | * | 12/2000 | Taff et al. | 430/30 |
| 6,248,428 B1 | * | 6/2001 | Asai et al. | 428/206 |
| 6,261,671 B1 | * | 7/2001 | Asai et al. | 428/206 |
| 6,344,371 B2 | * | 2/2002 | Fischer et al. | 438/106 |
| 6,376,049 B1 | * | 4/2002 | Asai et al. | 428/209 |
| 6,376,052 B1 | * | 4/2002 | Asai et al. | 428/209 |

* cited by examiner

*Primary Examiner*—Carl J. Arbes

(57) ABSTRACT

Disclosed herein are methods for modifying an inner-layer circuit feature of a printed circuit board. A trimming point on the inner-layer circuit feature is identified using an x-ray inspection system. The coordinates of the trimming point are then related to the coordinates of a visible reference marker on the printed circuit board. Next, the relationship between the visible reference marker and the trimming point is used to position a cutting tool over the trimming point. Finally, the cutting tool is used to make one or more cuts into the printed circuit board, until the inner-layer circuit feature is acceptably modified at the trimming point.

21 Claims, 9 Drawing Sheets

METHODS FOR MODIFYING INNER-LAYER CIRCUIT FEATURES OF PRINTED CIRCUIT BOARDS

FIELD OF THE INVENTION

The invention pertains to methods for modifying inner-layer circuit features of printed circuit boards.

BACKGROUND OF THE INVENTION

Printed circuit boards (PCBs) used in the electronic industry comprise a number of layers. Some of the layers comprise conductive traces, while other layers are non-conductive but for, perhaps, conductive vias joining traces found on other layers. Together, the layers of a PCB serve to route electrical signals between the various electrical components that are mounted to the PCB. The layers may also route signals to and from the PCB via traces that terminate at edge connectors, flex connectors, and other various contacts and connectors).

The layers of a PCB, as well as the pattern of conductive traces formed within each layer, are typically based on Computer Aided Design (CAD) data. The CAD data, in turn, is based on various design requirements and constraints that a designer inputs to the CAD system.

A significant problem with newly designed PCBs is that there is no easy way to test their functionality until their layers are fully assembled. Thus, in situations where an inner-layer layout error is detected during test, any repair effort must not only repair the inner-layer defect, but do so without endangering other surrounding circuit features. Unfortunately, this limits the available repair options.

When a choice is made to repair an inner-layer defect, the defect is typically repaired by means of a cutting tool such as a diamond cutter or laser. In order to position the cutting tool over the defect, two quantities must be estimated: 1) the coordinates of the defect, and 2) the depth of the defect. Unfortunately, PCB manufacturing variances make both of these quantities difficult to estimate. Estimating the coordinates of a defect can be difficult due to manufacturing variances in the alignment of layers, the tight spacing of traces within a layer and variations therein, etc . . . Manufacturing variances can also make it difficult to map the coordinates of a defect to a visible reference marker that can be used for the purpose of navigating a cutting tool over the defect. Estimating the depth of a defect is difficult in that the layers of a PCB are very thin and also subject to manufacturing variances. If a cutting tool penetrates a PCB too deep, or at the wrong location, it is likely that other circuit features of the PCB will be damaged.

In light of the above limitations of current PCB repair methods, there is no feasible way to repair an inner-layer defect of a PCB in significant quantities (i.e., when a large number of PCBs are found to carry the same inner-layer defect). As a result, the defective PCBs are typically scrapped; the inner-layer defect is fixed at the CAD level; a new lot of PCBs are assembled; and the test process is then repeated. One can therefore appreciate that an unanticipated inner-layer defect in a PCB is often associated with significant product development delays, and significant losses of time and money.

SUMMARY OF THE INVENTION

In one embodiment of the invention, a method for modifying an inner-layer circuit feature of a printed circuit board commences with the identification of a trimming point on the inner-layer circuit feature using an x-ray inspection system. The coordinates of the trimming point are then related to the coordinates of a visible reference marker on the printed circuit board. Next, the relationship between the visible reference marker and the trimming point is used to position a cutting tool over the trimming point. Finally, the cutting tool is used to make one or more cuts into the printed circuit board, until the inner-layer circuit feature is acceptably modified at the trimming point.

BRIEF DESCRIPTION OF THE DRAWINGS

Illustrative and presently preferred embodiments of the invention are illustrated in the drawings, in which.

DESCRIPTION OF THE PREFERRED EMBODIMENT

Figure 1:
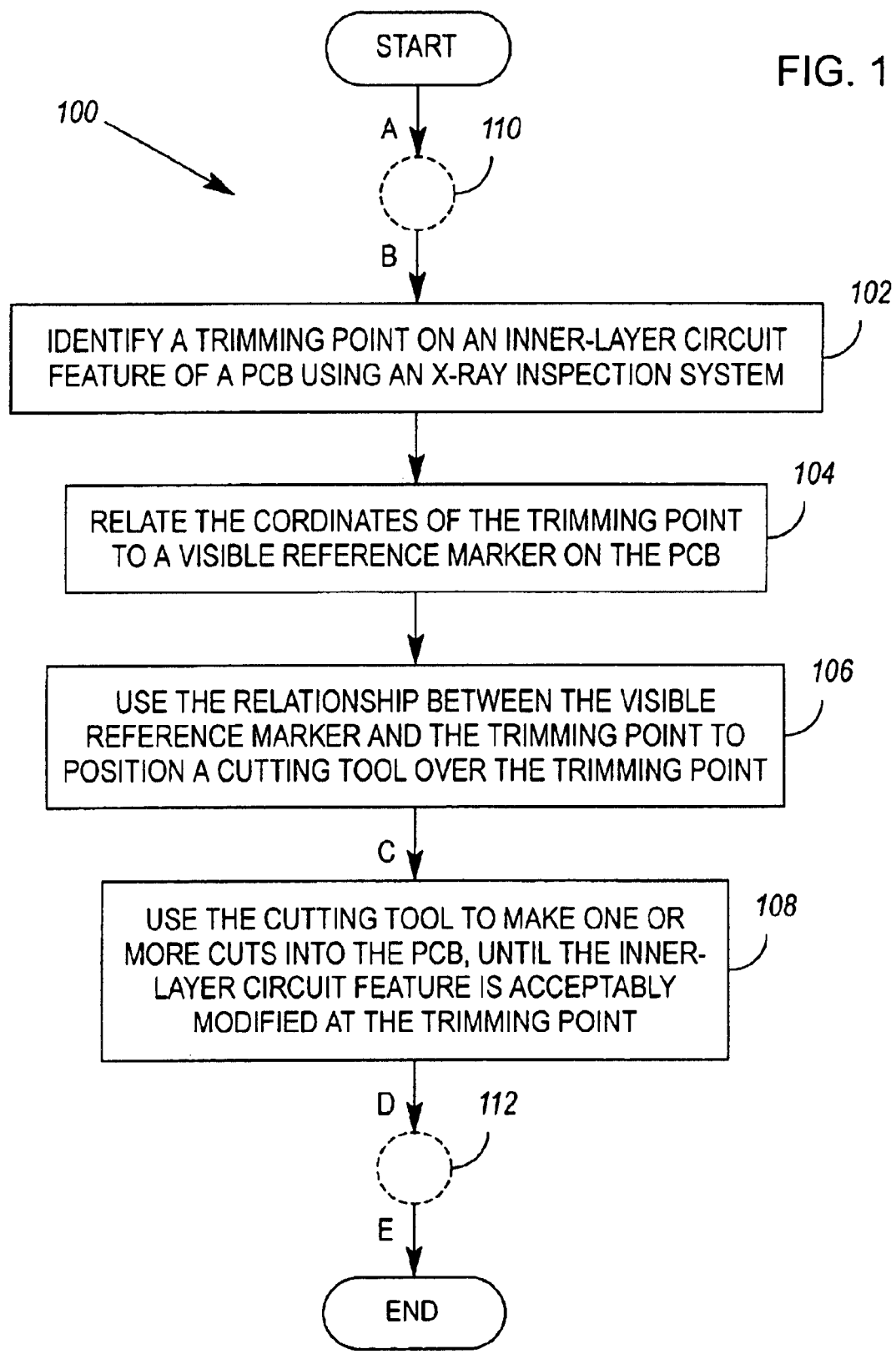
FIG. 1 illustrates a method for modifying an inner-layer circuit feature of a printed circuit board.

FIG. 1 illustrates a method 100 for modifying an inner-layer circuit feature (e.g., a trace) of a printed circuit board (PCB). The method 100 commences with the identification 102 of a trimming point on the inner-layer circuit feature using an x-ray inspection system. The coordinates of the trimming point are then related 104 to the coordinates of a visible reference marker on the printed circuit board. Next, the relationship between the visible reference marker and the trimming point is used to position 106 a cutting tool over the trimming point. Finally, the cutting tool is used 108 to make one or more cuts into the PCB, until the inner-layer circuit feature is acceptably modified at the trimming point.

The method 100 described in the preceding paragraph may be modified in a variety of ways, as will be understood by those who are skilled in the art. However, a number of modifications are set forth herein, some of which may be implemented by adding steps to the method 100 at points 110 and/or 112. These modifications are variously illustrated in FIGS. 2, 3, 14 & 15. The modifications 110a, 110b illustrated in FIGS. 2 & 3 will be discussed in the following paragraph, and the modifications 112a, 112b illustrated in FIGS. 14 & 15 will be discussed later in this description.

Figure 2:
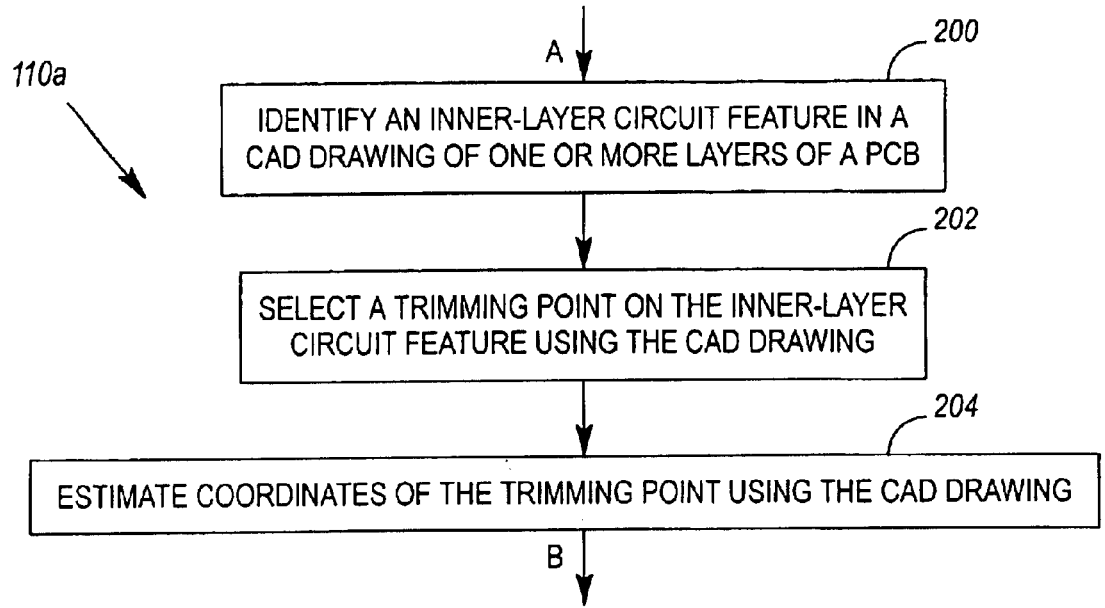
FIGS. 2 & 3 illustrate various modifications to the FIG. 1 method.
Figure 3:
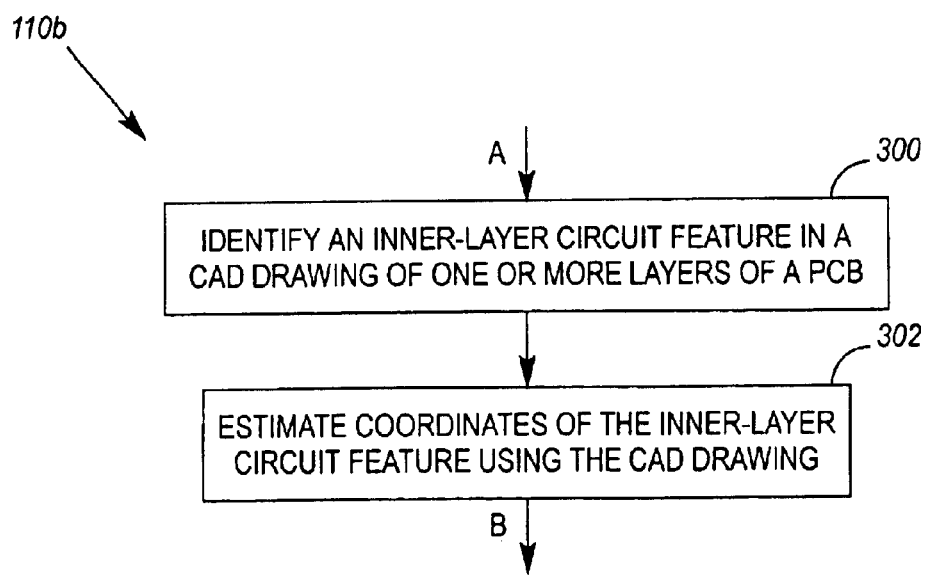

As illustrated in FIG. 2, prior to identifying a trimming point on an inner-layer circuit feature, the inner-layer circuit feature may be identified 200 in a Computer Aided Design (CAD) drawing of one or more layers of a PCB. The CAD drawing may also be used to select 202 a trimming point on the inner-layer circuit feature, and to estimate 204 the coordinates of the trimming point. The estimated coordinates of the trimming point may then be used to assist the x-ray inspection system in identifying 102 the trimming point (FIG. 1). Alternately, and as illustrated in FIG. 3, once the inner-layer circuit feature is identified 300 in the CAD drawing, the coordinates of the inner-layer circuit feature may be estimated 302. The coordinates of the inner-layer circuit feature may then be used to assist the x-ray inspection system in identifying the trimming point.

As defined herein, a "CAD drawing" may be a single drawing or a set of drawings.

Regardless of the manner in which the trimming point is first identified (i.e., whether by visual inspection of the CAD drawing, or by x-ray inspection of the PCB), care should be taken to identify a trimming point that is not buried under other circuit features. Also, preferably, the trimming point should be as distant from neighboring traces as possible. If upon x-ray inspection, it is determined that layer misalignment, trace variation, or other manufacturing variation has caused another circuit feature to interfere with an identified trimming point, a new trimming point should be chosen.

Figure 4:
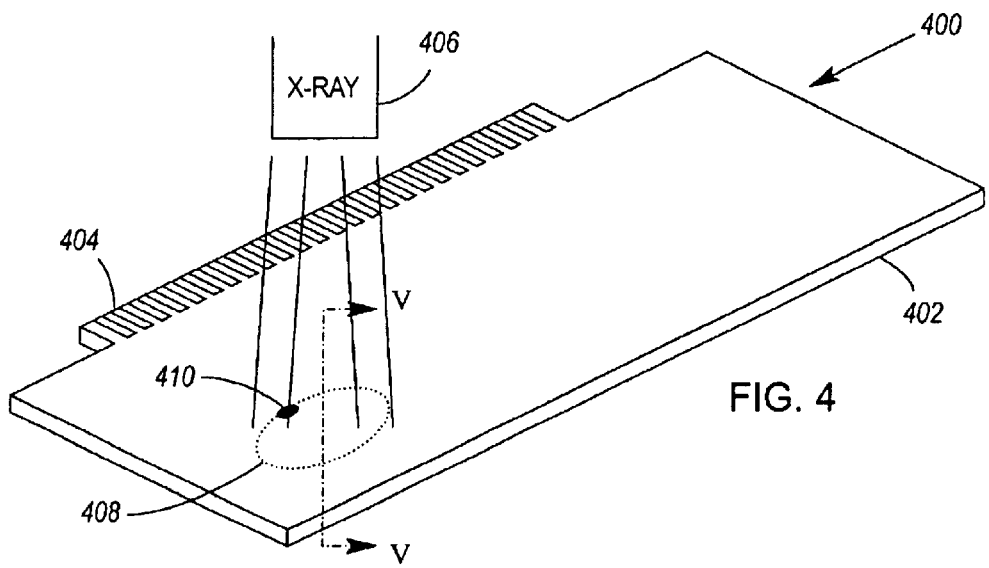
FIG. 4 illustrates a PCB.
Figure 5:
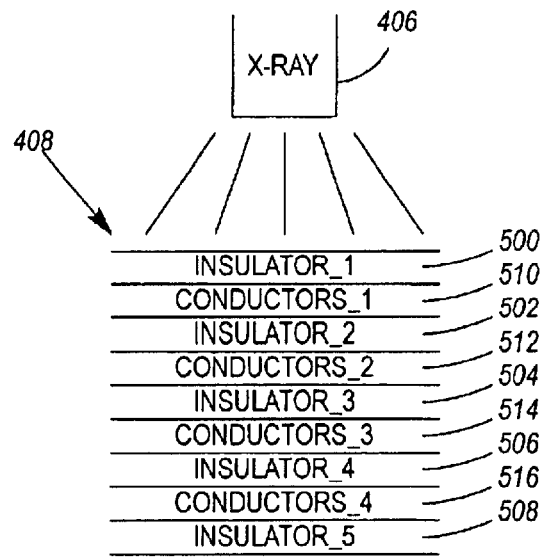
FIG. 5 illustrates a cross-section of the layers of the FIG. 4 PCB.

For the purpose of illustrating the FIG. 1 method 100 in practice, FIG. 4 illustrates an exemplary PCB 400. The PCB 400 comprises a main body portion 402, and a connector portion 404. A cross-section of the FIG. 4 PCB 400 is illustrated in FIG. 5. The cross-section comprises five insulating layers 500, 502, 504, 506, 508, and four conductive layers 510, 512, 514, 516. As will be understood by those who are skilled in the art, PCBs may take other and various forms.

In accordance with the method disclosed in FIG. 1, an x-ray inspection system 406 is positioned over the PCB 400 so that all or at least some portion 408 of the PCB 400 may be x-rayed. An image 600 (FIG. 6) is thereby generated from which the precise composition, placement and relations between the conductors 510–516 of the PCB portion 408 may be derived. Unlike a CAD image, the x-ray image 600 is an image of an actual device. As a result, shifts in traces and other PCB manufacturing variations are exposed in the x-ray image 600. At this point, an inner-layer circuit feature 514, as well as a trimming point 602 thereon, may be identified.

Figure 6:
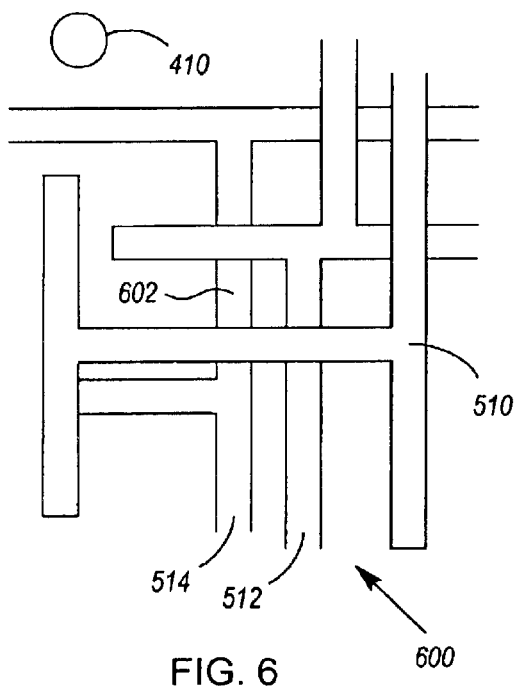
FIG. 6 illustrates an x-ray image of a portion of the FIG. 4 PCB.
Figure 7:
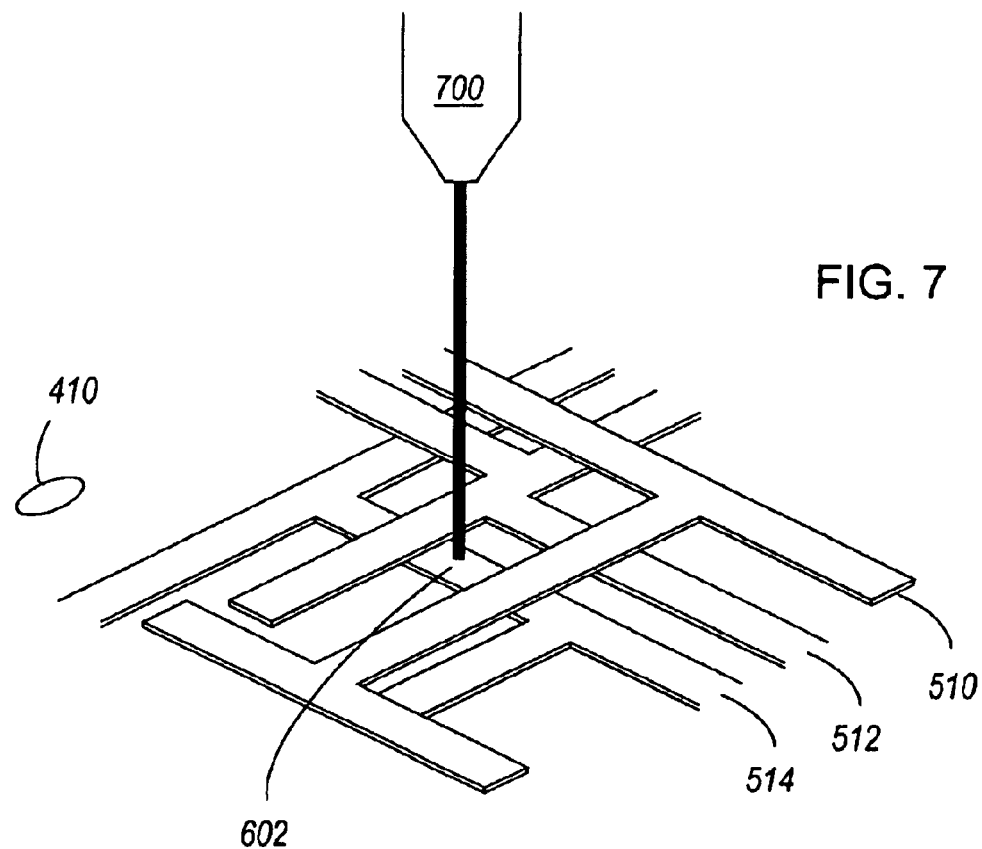
FIG. 7 illustrates a cutting tool positioned over a trimming point on the FIG. 4 PCB.
Figure 8:
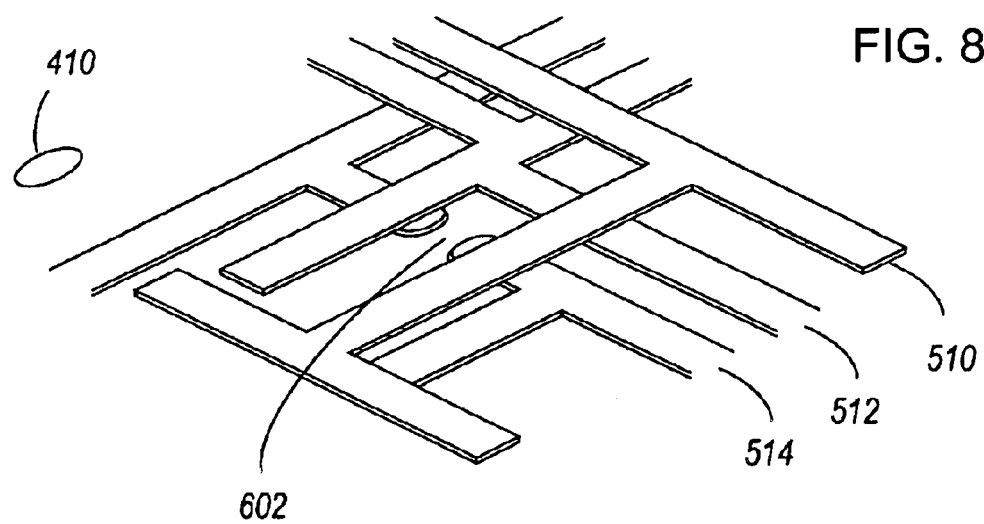
FIG. 8 illustrates the trace shown in FIG. 7 after it has been severed using the cutting tool shown in FIG. 7.

After identifying a trimming point 602, the coordinates of the trimming point 602 are related to the coordinates of a visible reference marker on the PCB 400. The visible reference marker may take a variety of forms. By way of example, the visible reference marker could be the coordinates of a PCB circuit feature such as: a surface level trace, a trace in an uppermost conductor level 510, a contact (e.g., a contact on the PCB's edge connector 404), or a component mounting contact 410 formed on the surface of the PCB 400. In FIGS. 4 & 6, the visible reference marker is a component mounting contact 410.

Preferably, the visible reference marker 410 is of such character that it may be easily identified by the x-ray inspection system 406. In this manner, the x-ray inspection system 406 may also be used to relate the coordinates of the trimming point 602 to the coordinates of the visible reference marker 410 (because both features will have been identified using the same coordinate system). Also, preferably, the visible reference marker 410 is initially identified in the same CAD drawing in which the trimming point 602 and/or its inner-layer circuit feature 514 is identified. An estimated relationship between the coordinates of the visible reference marker 410 and the trimming point 602 may therefore be determined prior to x-ray inspection; and a precise relationship between the coordinates may be noted during x-ray inspection.

As illustrated in FIGS. 7–10, the relationship between the visible reference marker 410 and the trimming point 602 is used to position a cutting tool 700 over the trimming point 602. Thereafter, the cutting tool 700 is used to make one or more cuts 108 (FIG. 1) into the PCB 400, until the inner-layer circuit feature 514 is acceptably modified at the trimming point.

Figure 11:
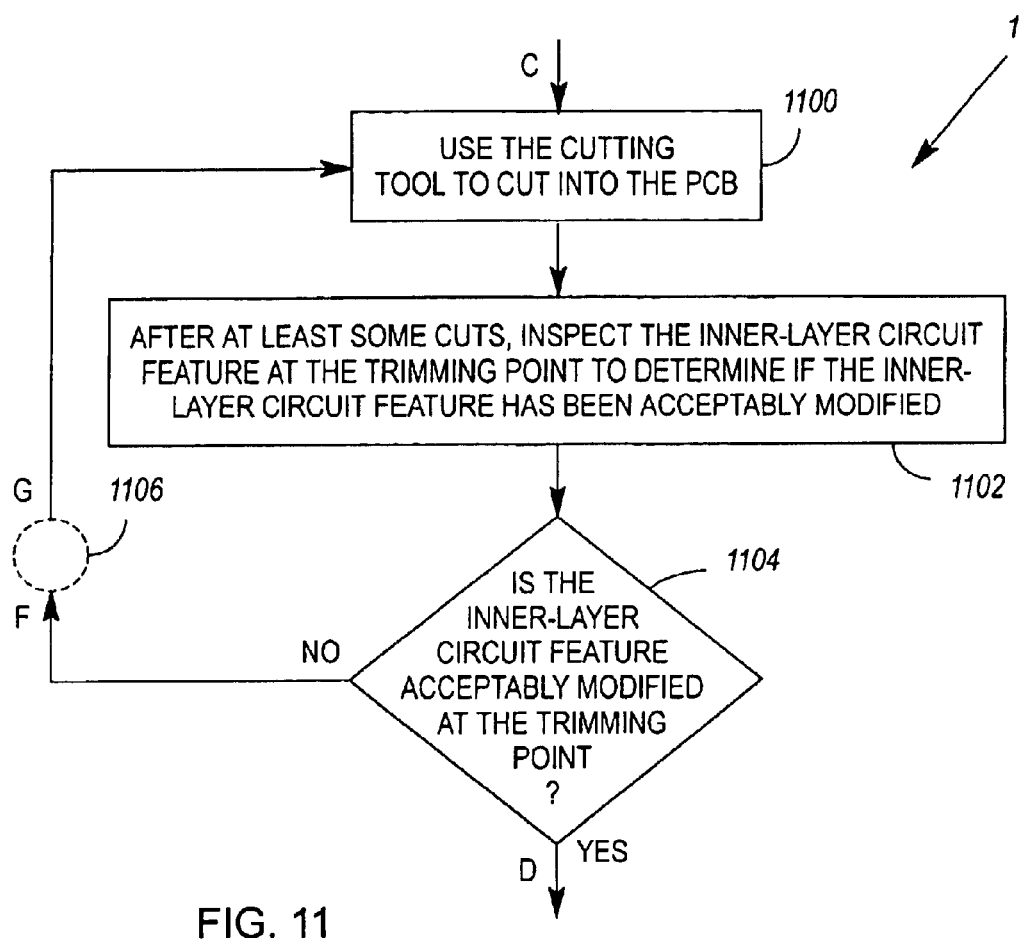
FIGS. 11–15 illustrate additional modifications to the FIG. 1 method.
Figure 12:
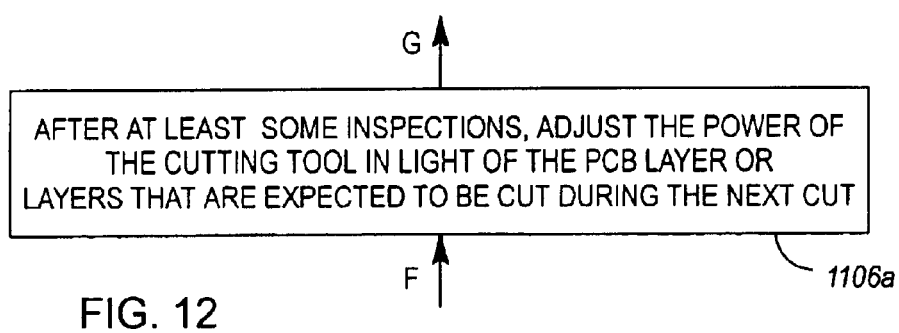
Figure 13:
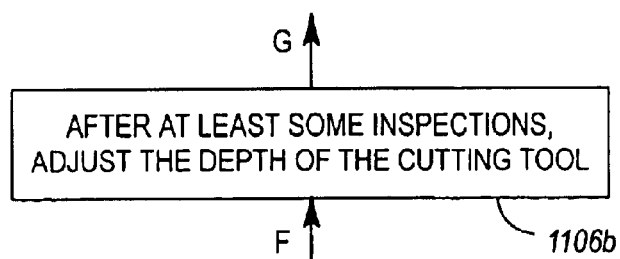

FIG. 11 illustrates a modification 108a of the cutting step illustrated in FIG. 1. In FIG. 11, after at least some of the cuts 1100 into the PCB 400 (and possibly after each cut), the inner-layer circuit feature 514 being modified is inspected 1102 at the trimming point 602 to determine if it has been acceptably modified 1104. Such inspections may be undertaken using the x-ray inspection system 406. In this manner, the position, power, depth and/or other characteristics of the cutting tool 700 may be adjusted as necessary between cuts, and the cutting process may be more carefully controlled. Some of these adjustments 1106a, 1106b are illustrated in FIGS. 12 & 13, and will be discussed later in this description.

A variety of instruments may be used as the cutting tool 700. For example, the cutting tool may be a Yttrium Aluminum Garnet (YAG) laser, an Excimer laser, or a diamond cutter.

If the cutting tool is a YAG laser, then for each cut made into the PCB 400, the power of the YAG laser's beam can be adjusted in light of the PCB layer or layers 500–516 that are expected to be cut during the next cut. This is illustrated in the modification 1106a to FIG. 11 illustrated in FIG. 12. The layers that are expected to be cut during the next cut may be determined by an estimated guess, or preferably, by x-ray inspection of the inner-layer circuit feature 514 being cut. Conductive materials such as copper tend to reflect a laser's beam to a greater extent. A laser's beam should therefore be adjusted to a higher power setting for cutting through conductive materials 510–516, thereby minimizing the number of cuts that need to be made to sever a conductive circuit feature 514. At the same time, the power of a laser's beam should be maintained low enough to avoid cutting through too many layers 500–516 of a PCB 400 at one time and risking penetration of circuit features 516 lying below (i.e., deeper than) the trimming point 602. Furthermore, even though lasers may make very precise and narrow cuts, the close spacing of traces in some PCBs may make it difficult to precisely align a cutting tool 700 prior to cutting. In some cases, it is therefore desirable to make an initial cut that does not penetrate deep enough to cut any necessary PCB circuit feature 514. The alignment of the cut, including the size of the cut and the existence of any debris related to the cut, may then be inspected 1102 (FIG. 11) prior to making additional cuts.

While some cutting tools (e.g., the YAG laser) may require power adjustments during the cutting process, other cutting tools (e.g., the diamond cutter) may require depth adjustments. In the latter case, it may again be desirable in some cases to begin with a shallower than needed cut so that alignment of the cutting tool 700 with respect to the trimming point 602 may be double-checked. Then, after at least some cuts (and possibly after each cut), the inner-layer circuit feature 514 being cut may be inspected 1102 at the trimming point to determine if the inner-layer circuit feature 514 has been acceptably modified 1104.

Figure 9:
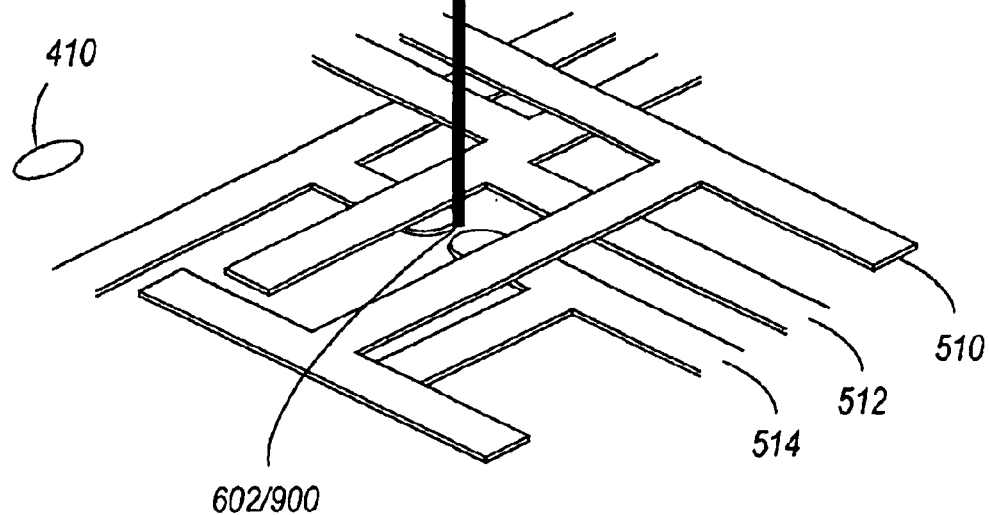
FIG. 9 illustrates a cutting tool positioned over a trimming point on the FIG. 4 PCB.
Figure 10:
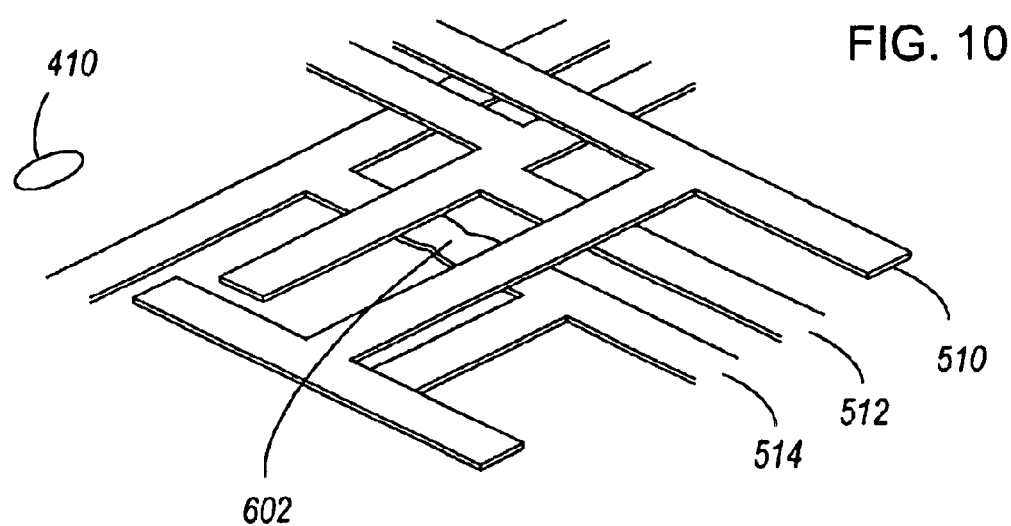
FIG. 10 illustrates the traces shown in FIG. 9 after they have been fused using the cutting tool shown in FIG. 9.
Figure 14:
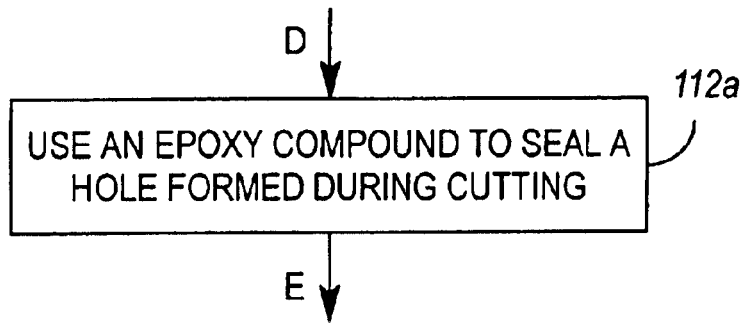
Figure 15:
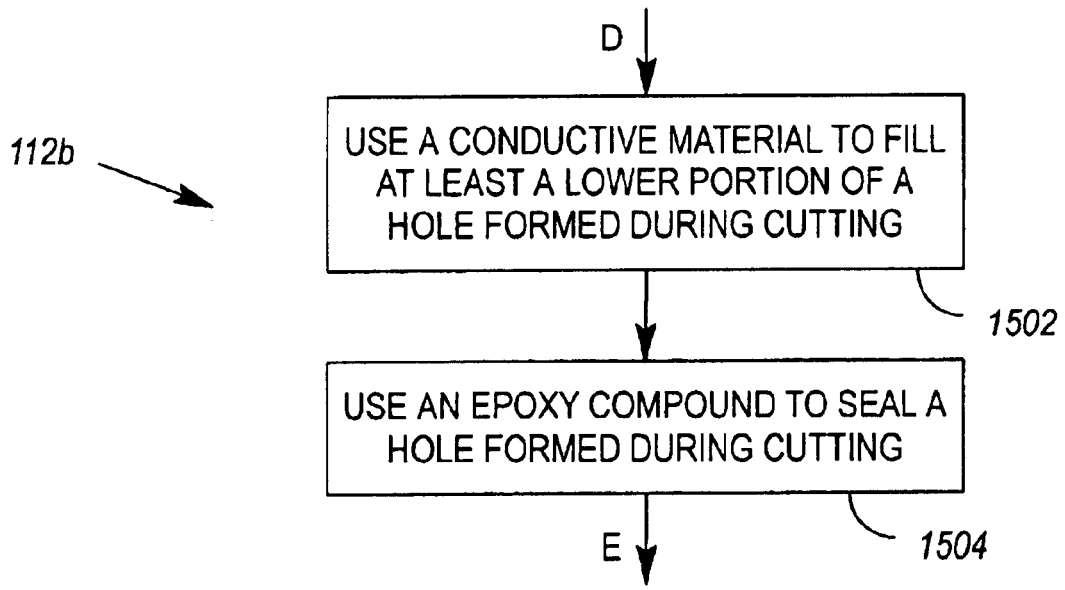

Possible and acceptable modifications of the inner-layer circuit feature 514 include, but are not limited to, severance of the circuit feature 514 (as shown in the "before" and "after" sequence depicted in FIGS. 7 & 8) and fusing of the circuit feature 514 (as shown in the "before" and "after" sequence depicted in FIGS. 9 & 10). After an acceptable modification has been achieved, an epoxy compound may be used to seal 112a any hole (or holes) that is formed during cutting (FIG. 14). Additionally, and assuming that the inner-layer circuit feature is, for example, a gap 900 between conductive traces (see FIG. 9), some or all of the hole that is formed during cutting may be filled 1502 with a conductive material (FIG. 15). For example, if the hole terminates substantially in between two conductive traces that need to be joined, the lower portion of the hole may be filled 1502 with a conductive material such as copper. The upper portion of the hole could then be filled 1504 with an epoxy compound. Alternately, if a trimming point 602 is identified on top of a conductive trace, the entire hole can be filled with conductive material, thereby allowing a device (or ground) that is external to the PCB 400 to make electrical contact with the inner-layer trace.

The above methods have numerous applications. One application is the repair and recovery of PCBs with defective inner-layer traces. As previously explained, shorted traces may be severed, and traces that need to be joined may be bridged by filling all or part of a hole with a conductive material.

Figure 16:
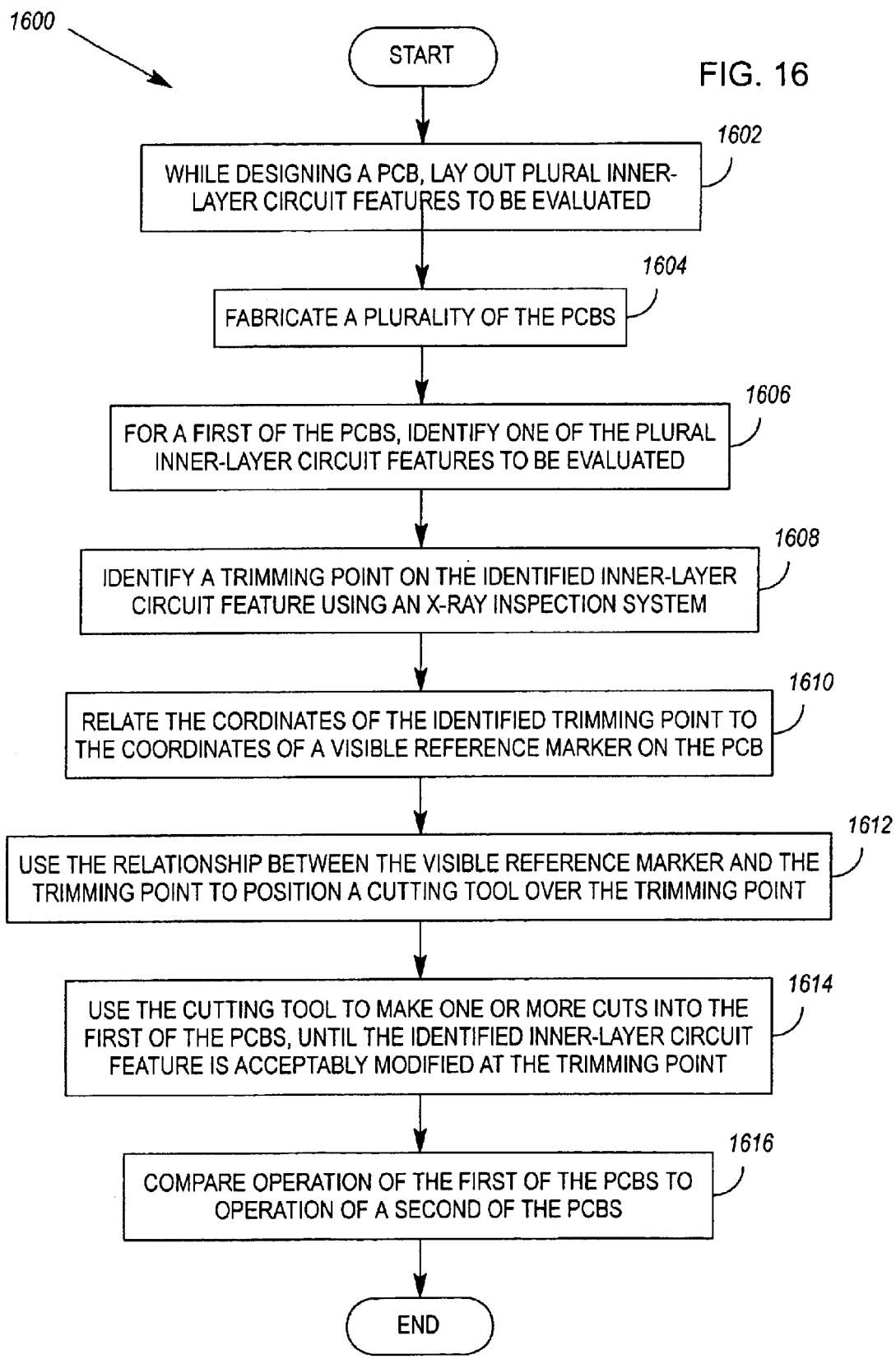
FIG. 16 illustrates a method for developing a printed circuit board.
Figure 17:
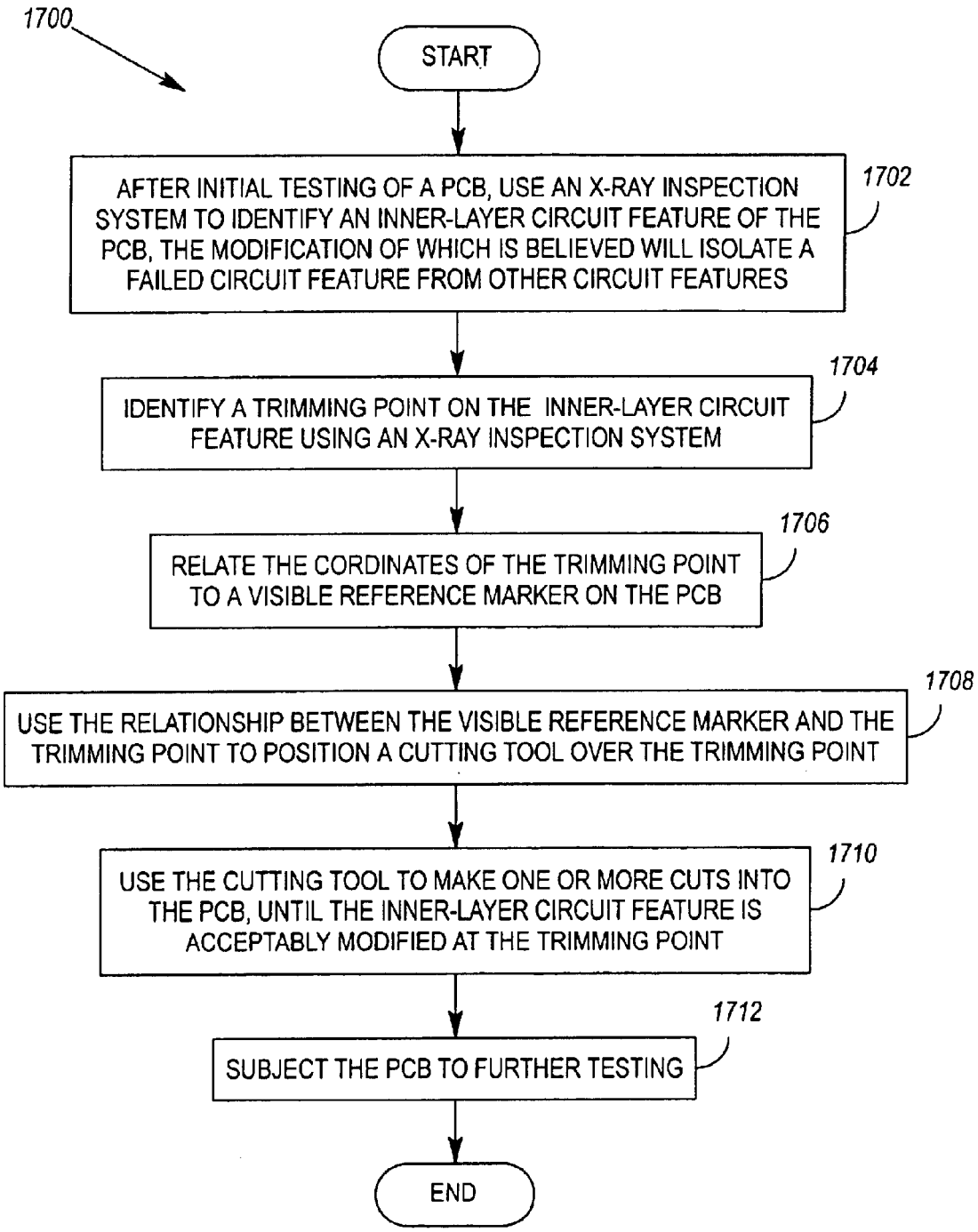
FIG. 17 illustrates a method for isolating what is believed to be a failed circuit feature in a printed circuit board.

Another application for the above methods is in research and development. For example, while designing a PCB, a designer can lay out 1602 (FIG. 16) a plurality of inner-layer circuit features that he or she would like to evaluate. A plurality of the PCBs can then be fabricated 1604, and different ones of the plural inner-layer circuit features can be modified in different ones of the PCBs. Thus, for example, one of the plural inner-layer circuit features can be identified 1606 in a first of the PCBs; and a trimming point can be identified 1608 thereon. The coordinates of the trimming point can then be related 1610 to the coordinates of a visible reference marker on the PCB. Thereafter, a cutting tool may be positioned 1612 over the trimming point, and the PCB may be cut 1614 one or more times until the inner-layer circuit feature is acceptably modified. Testing may then be initiated to compare 1616 operation of the first PCB to operation of a second PCB. If the second PCB has not been modified, or has been modified differently than the first PCB, the designer can determine which of the plural inner-layer circuit features is most effective (or which of the plural features work at all).

The above design methodology 1600 could be advantageous, for example, where capacitive effects between traces, as well as other phenomenon, cannot be accurately modeled in a software environment.

Yet another application for the above methods is in isolating what is believed to be a failed circuit feature in a PCB. For example, after initial testing of a PCB, an x-ray inspection system can be used to identify 1702 an inner-layer circuit feature of the PCB, the modification of which is believed will isolate a failed circuit feature from other circuit features. The x-ray inspection system can then be used to identify 1704 a trimming point on the inner-layer circuit feature. Thereafter, the coordinates of the trimming point can be related 1706 to a visible reference marker on the PCB, and this relationship can be used to position 1708 a cutting tool over the trimming point. After the inner-layer circuit feature has been acceptably modified 1710, the PCB can be subjected to further testing 1712.

While illustrative and presently preferred embodiments of the invention have been described in detail herein, it is to be understood that the inventive concepts may be otherwise variously embodied and employed, and that the appended claims are intended to be construed to include such variations, except as limited by the prior art.

What is claimed is:

1. A method for modifying an inner-layer circuit feature of a printed circuit board, comprising:
   a) identifying a trimming point on the inner-layer circuit feature using an x-ray inspection system;
   b) relating coordinates of the trimming point to coordinates of a visible reference marker on the printed circuit board;
   c) utilizing the relationship between the visible reference marker and the trimming point to position a cutting tool over the trimming point; and
   d) utilizing the cutting tool to make one or more cuts into the printed circuit board, until the inner-layer circuit feature has been acceptably modified at the trimming point.

2. A method as in claim 1:
   a) further comprising, prior to identifying the trimming point using the x-ray inspection system:
      i) identifying the inner-layer circuit feature in a CAD drawing of one or more layers of the printed circuit board;
      ii) selecting a trimming point on the inner-layer circuit feature using the CAD drawing;
      iii) estimating coordinates of the trimming point using the CAD drawing; and
   b) wherein the estimated coordinates of the trimming point are used to assist the x-ray inspection system in identifying the trimming point.

3. A method as in claim 1:
   a) further comprising, prior to identifying the trimming point using the x-ray inspection system:
      i) identifying the inner-layer circuit feature in a CAD drawing of one or more layers of the printed circuit board;
      ii) estimating coordinates of the inner-layer circuit feature using the CAD drawing; and
   b) wherein the estimated coordinates of the inner-layer circuit feature are used to assist the x-ray inspection system in identifying the trimming point.

4. A method as in claim 1, further comprising identifying the visible reference marker using the x-ray inspection system, and wherein the coordinates of the trimming point are related to the coordinates of the visible reference marker using the x-ray inspection system.

5. A method as in claim 1, wherein the visible reference marker is a contact formed on the surface of the PCB.

6. A method as in claim 1, wherein the cutting tool is a YAG laser.

7. A method as in claim 6, wherein, for each of the one or more cuts into the printed circuit board, the power of the YAG laser's beam is adjusted in light of the printed circuit board layer or layers that are expected to be cut during the next cut.

8. A method as in claim 1, wherein the cutting tool is a diamond cutter.

9. A method as in claim 1, wherein the cutting tool is an Excimer laser.

10. A method as in claim 1, further comprising, after at least some of the one or more cuts into the printed circuit board, inspecting the inner-layer circuit feature at the trimming point to determine if the inner-layer circuit feature has been acceptably modified.

11. A method as in claim 10, wherein the inspections of the inner-layer circuit feature are performed using the x-ray inspection system.

12. A method as in claim 10, wherein, after at least some inspections of the inner-layer circuit feature at the trimming point, the depth of the cutting tool is adjusted.

13. A method as in claim 10, wherein, after at least some inspections of the inner-layer circuit feature at the trimming point, the power of the cutting tool is adjusted in light of the printed circuit board layer or layers that are expected to be cut during the next cut.

14. A method as in claim 1, further comprising, after the inner-layer circuit feature is acceptably modified at the trimming point, utilizing epoxy compound to seal a hole formed during cutting.

15. A method as in claim 1, further comprising, after the inner-layer circuit feature is acceptably modified at the trimming point, filling with a conductive material, at least a lower portion of a hole formed during cutting.

16. A method as in claim 1, wherein the modification to the inner-layer circuit feature is a severing of the inner-layer circuit feature.

17. A method as in claim 1, wherein the inner-layer circuit feature is a circuit trace.

18. A method for developing a printed circuit board, comprising:
   a) while designing the printed circuit board, laying out plural inner-layer circuit features to be evaluated;
   b) fabricating a plurality of the printed circuit boards;
   c) for a first of the printed circuit boards,
      i) identifying one of the plural inner-layer circuit features to be evaluated;
      ii) identifying a trimming point on the identified inner-layer circuit feature using an x-ray inspection system;
      iii) relating coordinates of the trimming point to coordinates of a visible reference marker on the printed circuit board;
      iv) utilizing the relationship between the visible reference marker and the trimming point to position a cutting tool over the trimming point;
      v) utilizing the cutting tool to make one or more cuts through the printed circuit board, until the identified inner-layer circuit feature is acceptably modified at the trimming point; and
   d) comparing operation of the first of the printed circuit boards to operation of a second of the printed circuit boards.

19. A method as in claim 18, wherein the second of the printed circuit boards has not been modified.

20. A method as in claim 18, wherein the second of the printed circuit boards has been modified differently than the first printed circuit board.

21. A method for isolating what is believed to be a failed circuit feature in a printed circuit board, comprising:
   a) after initial testing of the printed circuit board, using an x-ray inspection system to identify an inner-layer circuit feature of the printed circuit board, the modification of which is believed will isolate the failed circuit feature from other circuit features;
   b) identifying a trimming point on the inner-layer circuit feature using the x-ray inspection system;
   c) relating coordinates of the trimming point to coordinates of a visible reference marker on the printed circuit board;
   d) utilizing the relationship between the visible reference marker and the trimming point to position a cutting tool over the trimming point;
   e) utilizing the cutting tool to make one or more cuts through the printed circuit board, until the inner-layer circuit feature is acceptably modified at the trimming point; and
   f) subjecting the printed circuit board to further testing.

* * * * *